(12) United States Patent
Zhou et al.

(10) Patent No.: US 6,727,791 B2
(45) Date of Patent: Apr. 27, 2004

(54) CAPACITIVE VOLTAGE TRANSFORMER

(75) Inventors: Youdong Zhou, No. 4 Huancheng Road (North), Mazhu Town, Yuyao City, Zhejiang (CN); Decai Wang, Yuyao (CN)

(73) Assignee: Youdong Zhou, Yuyao (CN)

( * ) Notice: Subject to any disclaimer, the term of this patent is extended or adjusted under 35 U.S.C. 154(b) by 0 days.

(21) Appl. No.: 10/309,211

(22) Filed: Dec. 4, 2002

(65) Prior Publication Data

US 2003/0146815 A1 Aug. 7, 2003

(30) Foreign Application Priority Data

Feb. 5, 2002 (CN) .......................................... 2215653 A

(51) Int. Cl.$^7$ ............................................... H01F 21/02
(52) U.S. Cl. ........................... 336/20; 336/69; 336/122; 336/83; 323/355; 323/356; 323/357; 323/358; 323/359
(58) Field of Search .......................... 336/20, 180, 182, 336/69, 122, 83; 323/355–359, 340

(56) References Cited

FOREIGN PATENT DOCUMENTS

CN            99255044            11/1999

*Primary Examiner*—Lincoln Donovan
*Assistant Examiner*—Jennifer A. Poker
(74) *Attorney, Agent, or Firm*—Crowell & Moring LLP

(57) ABSTRACT

A capacitive voltage transformers for distribution of the power from 10 kv high potential line, includes a insulating column with a high potential terminal, a ground terminal and capacitors C1 and C2 in series connection. The column is filled with oilless dry filler. The capacitors C1 and C2 formed by a plurality of separated metallized film capacitors respectively in series or in parallel connection. At the tapping point between the capacitors there is a leading-out terminal of the secondary voltage which is connected to an induction transformer L in parallel. The transformer includes a frame with "C" shaped iron cores and windings wound around the cores. There is an over-voltage protector P connected in parallel between the tapping point and ground. A capacitive voltage divider is integrally combined with the transformer to provide a small volume, low cost device with a savings in materials.

9 Claims, 2 Drawing Sheets

CAPACITIVE VOLTAGE TRANSFORMER

This application claims the priority of Chinese Patent Application No. 02215653.4, filed Feb. 5, 2002, the disclosure of which is expressly incorporated by reference herein.

BACKGROUND AND SUMMARY OF THE INVENTION

The present invention relates to the high voltage electric power transmission, particularly relates to the electric power transmission apparatus to take-off secondary electric power source from (10 kv) high voltage line.

Voltage transformers are employed at present for reducing the voltage from 10 kv to 220 v or lower. Prior art voltage transformer have multiple windings and heavy iron-cores with some defects in insulation. These bulk volume transformers are not suitable for electric transmission line networks and cannot serve as bus-line insulating support rods.

The voltage transformers and capacitive divider of the prior art are not well electrically isolated from the high voltage.

Conventional high-voltage capacitive voltage transformers have an ordinary configuration which is formed by co-axial winding capacitive elements or a multi-coaxial cylindrical coupling capacitor. They all use film-paper complex medium which requires treatment by vacuum technology and subsequently requires heat-treatment and filling with dehydrated and gasless insulating fluid such as oil for sealing the hollow insulating column. This process is complex and difficult to control. These transformers are large in volume, high in cost, and unsuitable for applying on 10 kv networks. They can only be used on very high voltage electric transmission networks. The Chinese patent ZL99255044.0 refers to a new dry-type voltage transformer that adopt the co-axial circular capacitive element being fixed on tubular electric electrodes. It is difficult for this voltage transformer to output higher current owing to the defect in its structure. The output current flutter under the influence of primary current. Its application is limited to energizing voltage-meters or providing an electric power source for protective relay purposes if they have a power amplifier. It is difficult to manufacture the capacitive elements inside the hollow insulating case, which can be simultaneously used as a supporting rod. Furthermore, it is more difficult to provide secondary operations on 10 kv electric transmission networks, and it also hard to supply the secondary power source needed by automation of electric power distribution.

A principal object of the present invention is to overcome the above-mentioned defaults existing in the prior arts and provide a capacitive voltage transformer (CVT) which serves as a secondary operation mechanism in the networks of 10 kv electronic power distribution networks and can also provide electric power source needed by automatization of power distribution networks. It is compact in structure, and less costly.

A further object is to provide improvement in the safe separation of a load from the high potential for the sake of safety. A still further object is to improve the load characteristic.

A counter-proportionality relationship exists between voltage and capacity at two ends of a capacitor, and a sufficient resonance between capacitive impedance and inductance impedance can provide a precise, stable and high energetic power source to drive a load.

According to these principles, the capacitive voltage transformer of the present invention is designed to be connected with a high voltage line in order to provide voltage reduction by including a capacitive voltage divider having an insulating hollow case with an electric connection terminal connected with a high voltage line and having another connection terminal being grounded. Capacitors C1 and C2 are series connected between high voltage line and ground. One end of the series connection of capacitors C1 and C2 is connected to the high voltage line, and the other end of the series connector of C1 and C2 is grounded A secondary voltage output terminal is the tapping point between capacitor C1 and C2. The capacitor C2 is connected electrically in parallel with an induction transformer between the tapping points of the capacitors and ground.

The present invention has the following characteristics:

(a) The capacitors of the capacitive voltage divider are placed in an insulating hollow case with insulator shed rings, which is filled with oilless dry insulating filler for insulating and fixing the capacitors within the case. Capacitors C1 and C2 are formed respectively by plural metallized film capacitors which are arranged electrically in parallel or in series with each other.

Said case could be a hollow column.

(b) Induction transformer L includes a primary impedance winding connected between the tapping point of capacitor C1, C2 and ground, as well as a secondary voltage transformer winding directly being wound around the iron-cores having a "C" shape.

The upper end of the column of the capacitive voltage transformer is connected with high-voltage of the electric power transmission line and the bottom end thereof is grounded. The column of capacitive voltage divider has an insulating sheath with plural shed rings on the outside.

The filler within the said column is formed by mixing insulating filling material and epoxy resin.

There are two prefabricated securing screw holes respectively arranged at the high voltage end and ground end of the said insulating column.

The induction transformer L has a frame for fixing the iron-cores, which further includes a bottom part on which there are two vertically standing securing bolts. The upper end of the frame has a securing plate (or strip) having a "U" shape.

Based on a comparison of the prior art and the improved capacitive voltage transformer of the present invention, the capacitive impedance and inductive impedance are integrally combined in the present invention to reach an ideal resonant effect. Hence the satisfactory characteristics are obtained. The present invention provides many advantages such as compactness in volume and savings in consumption of the material to reduce the cost of manufacture. It also solves the difficulties concerning secondary operation in the 10 kv electric power transmission networks. It provides the ideal secondary power source at or under 220V with high precision highly stabilities, effective power factor to energize the high-voltage switches, high-voltage power measuring apparatus, and provides operations of automatic control system of 10 kv power distribution. The power level can reach 22VA, the precision can reach 0.2-grade. Because of good insulation between load and high-voltage, the delivered electric power is reliable, load characteristics are greatly improved, and good insulation is obtained. Tests prove that the structure of the present invention can withstand an over-voltage 2.5 times larger than the rated working-voltage for one minute without flutter or breakdown. Even at temperatures of ☐15° C. ☐☐40° C., stable working-voltage and current can be guaranteed. It not only can withstand the mechanical impact with 800N which comes along axial direction or radial direction, but also can continuously withstand 6000 times dynamic loading tests.

BRIEF DESCRIPTION OF THE DRAWINGS

Further characteristics and advantages of the present invention will be clearly understood upon reading the following description made with reference to the attached drawings ☐wherein.

DETAILED DESCRIPTION OF THE PREFERRED EMBODIMENT

Figure 1:
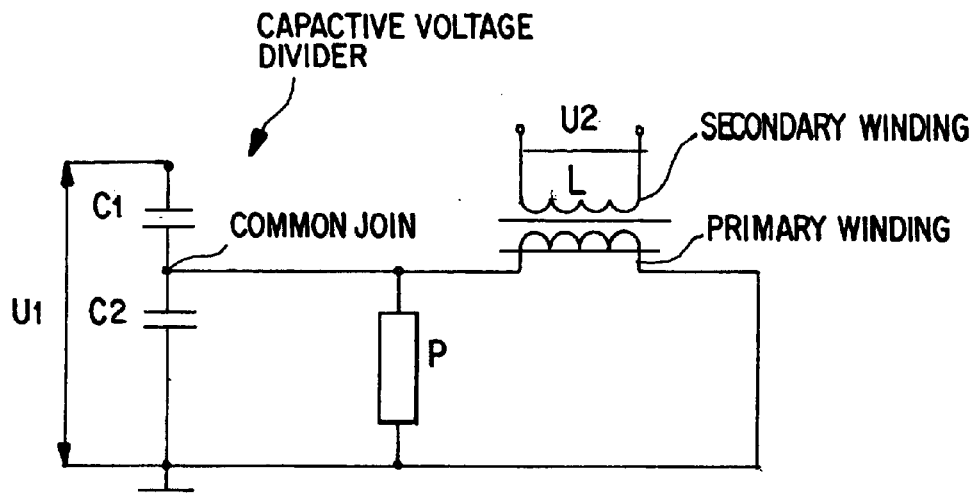
FIG. 1 is schematic circuit of a device illustrating the working principle.

The capacitive voltage transformer includes capacitive voltage divider (refer to FIG. 1 and FIG. 2), the capacitive voltage divider having a insulating columm which consist of a silicone rubber insulating sheath with a plurality of shed rings 1 and a hollow insulating column 3 made of epoxy resin.

The epoxy resin hollow insulating column 3 is placed within the silicone rubber insulating sheath 1. The two interior holes 6 at the two ends of the column 3 are screw holes.

There are two metallic enclosing lids 2, 5 at the two ends of the column 3, which respectively form two securing ends of the hollow insulating column 3, and are respectively being as a high potential terminal of 10 kv line network and the grounded terminal. The grounded terminal is made into a co-axial multiple circulars provided with holes (not shown) for pouring the filler into the hollow column 3.

The metallic lid 2 has a prefabricated screw hole 6 for connecting to high potential line. The grounded metallic lid 5 also has a prefabricated screw hole 6 for securing the apparatus such as high potential electric switches, high potential measuring box. Capacitors C1 and C2, connected in series, are positioned within the column 3 and between the said high potential end and the ground end of the column 3. The capacitors C1 and C2 are manufactured by high voltage-resistant, high temperature-resist or very low temperature-resistant medium, and formed by plural metalilized film capacitors in parallel or in series connections. C1 is a high potential capacitor which is electrically connected with a high potential line at one end thereof. Capacitor C2 allows for the take-off voltage with one terminal being grounded. At the tapping point (common join) of the capacitor C1 and C2 there is a conductive lead-out. The voltage across and between the tapping point and the grounded terminal is a secondary voltage source which is in parallel with an inductance coil that is the primary winding of the induction transformer L.

Figure 2:
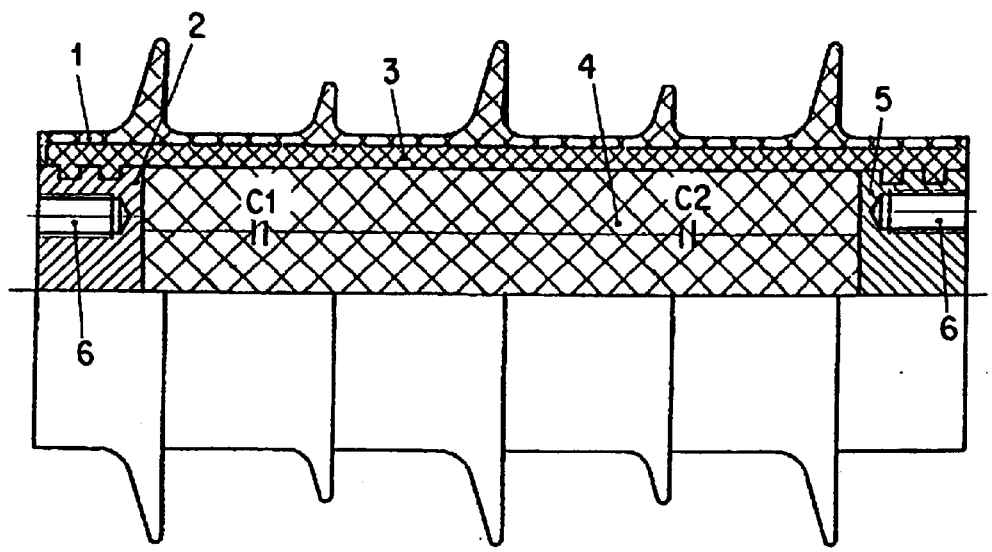
FIG. 2 is a sectional view of the insulator column within which the capacitors C1 and C2 are accommodated constituting the capacitive voltage divider of the present invention.

U1, indicated in FIG. 1, represents an inputting 10 kv voltage from a high potential electric transmission line. U2 is the output secondary voltage. After the combined capacitors C1 and C2 are placed into the column 3 with the bottom terminal of the column being grounded, then the insulating filling material 4 is poured into the column 3 to fix the combined capacitors C1 and C2 via a hole (not shown). The filler 4 is a mixture of insulating filling material and epoxy resin.

Figure 4:
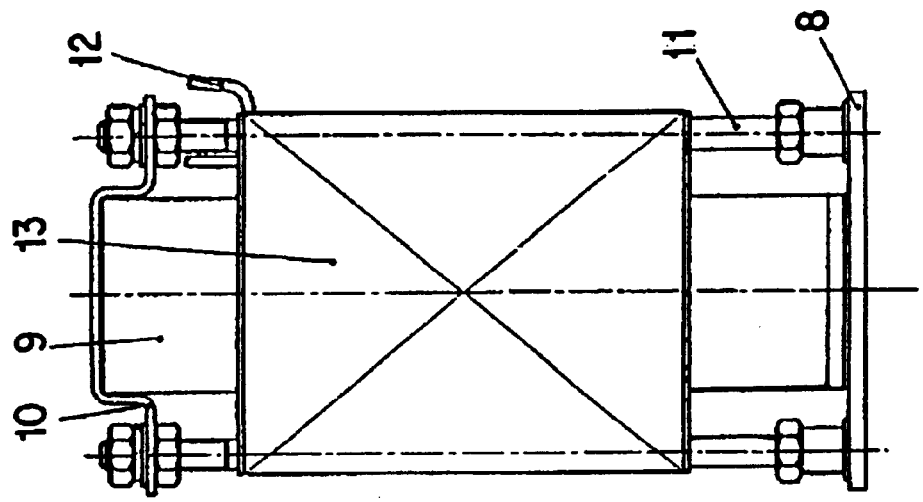
FIG. 4 is the schematic left view of the induction transformer of FIG. 3.
Figure 3:
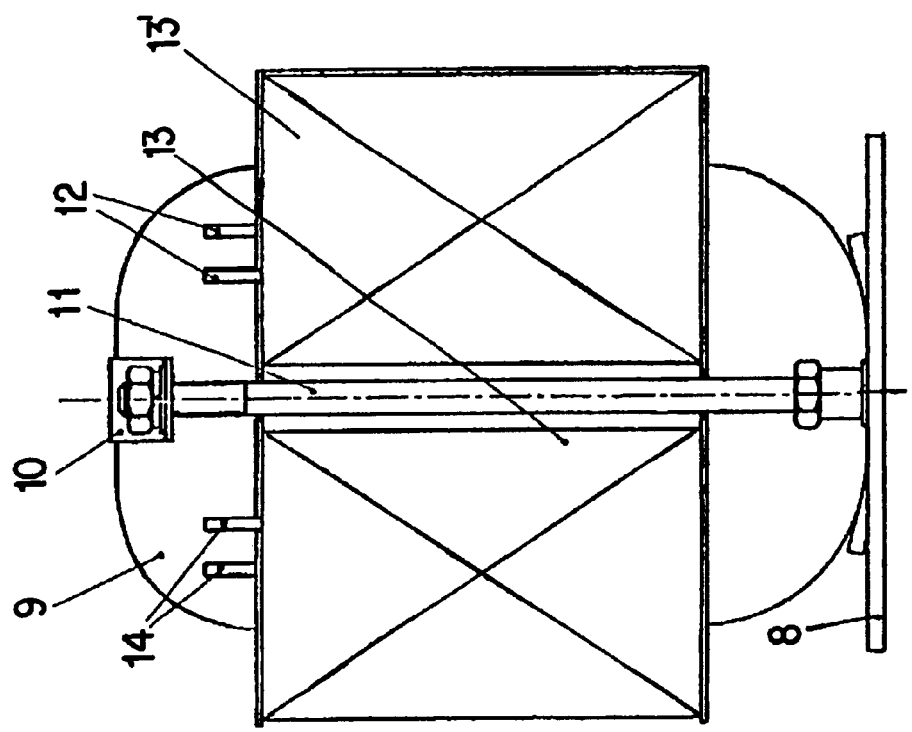
FIG. 3 is a schematic front view of an induction transformer according to the present invention.

The induction transformer L (as shown in FIG. 3 and FIG. 4) is provided with two "C" shaped iron cores 9 which face each other and include a fixing frame with base 8 on the bottom thereof, on which there are two vertically standing fixing bolts 11 having "U" shaped pressing plate 10 at the upper, parts thereof for fixing the "C" shaped iron core. There are two windings 13 and 13' coiled around the iron cores, which is respectively a primary inductance reactance winding and secondary winding of the transformer L.

The windings 13 and 13' have two pairs of lead out terminals designated respectively by 12 and 14, the terminal 14 being the lead-out terminals of the secondary winding of the transformer, which is directly connected with a load. The positions of terminal 12 and terminal 14 are interchangeable. There is an over voltage protector in parallel with and across the capacitor C2, which is placed between the secondary potential terminal and ground. The starting operating voltage of the protector is 1.7 times ±5% larger than rating operation voltage thereof.

The protector has a neon tube flashing display indicator, when the voltage of 10 kv potential terminal suddenly rises in the event of a fault affecting the line. The protector is rapidly and automatically switched on to prevent the secondary voltage circuit from being influenced and damaged by the fault in the high voltage line. When the potential of the line return to near the normal operation voltage, the circuit is automatically restored to normal indicating removal of the faults.

Capacitors in AC circuits are either charged or discharged and can thus be used to form a voltage divider with the voltage value of two ends of the capacitors maintaining the inverse-proportion relationship to the magnitude of the value of capacitance. If the capacitance value of the capacitors C1 and C2 change, the different value of the secondary voltage U2 can be obtained. In accordance with the principle of resonance between capacitors and inductance, there is a mutual-compensation and mutual-effect relationship between them. Hence, when the magnitudes of the capacitance and inductance reach the optimum condition the resonance is created and satisfactory secondary power source is acquired to permit the voltage of the secondary to be in nearly the same phase as the primary voltage and having nearly the same voltage ratio. The ratio of the voltage U1 to U2 is equal the ratio of the capacitance of C1+C2 to the capacitance of C1 when the resonance being established in the circuit constituted by capacitor C1+C2 and inductance L.

This formula $$k = \frac{U_1}{U_2} = \frac{C_1 + C_2}{C_1}$$

explains the relationship between capacitance and inductance of the circuit when the resonance occurs, with k representing the ratio of voltage of U1 to U2.

The feature of the present invention is combination of capacitance and inductance to obtain optimum resonance so the capacitive voltage transformer of the present invention has the name of "capacitive inductive voltage transformer" (CIVT).

The foregoing disclosure has been set forth merely to illustrate the invention and is not intended to be limiting. Since modifications of the disclosed embodiments incorporating the spirit and substance of the invention may occur to persons skilled in the art, the invention should be construed to include everything within the scope of the appended claims and equivalents thereof.

What is claimed is:

1. A capacitive voltage transformer arrangement for reducing a high voltage to a lower voltage, said arrangement comprising:

a capacitive voltage divider provided in an insulating case having a first terminal adapted to be connected with said high voltage, and a second terminal adapted to be connected to ground, said capacitive voltage divider being formed by a series connection of a first capacitor and a second capacitor wherein one end of said first capacitor is connected to said first terminal and one end of said second capacitor is connected to said second terminal and wherein a second end of said first capacitor and a second end of said second capacitor are connected to each other and form a common join; and an induction transformer having a primary winding having a first end connected to said common join, and a second end of said primary winding being connected to ground, said induction transformer further including a secondary winding providing said lower voltage and adapted to be connected to a load, wherein said primary winding is an impedance coil which creates a resonance circuit with said second capacitor.

2. The arrangement according to claim 1, wherein said insulating case is filled with an oilless, dry filler.

3. The arrangement according to claim 1, wherein said induction transformer includes two "C" shaped iron cores with a first winding arranged around a first of said two iron cores and a second winding wound around the second of said two iron cores wherein open portions of said "C" shaped iron cores face each other.

4. The arrangement according to claim 1, further including a protective means connected between a first end of said primary winding of said transformer and ground.

5. The arrangement according to claim 1, wherein said insulating case comprises an insulating column having an insulating sheath with multiple insulating shed rings outside said sheath.

6. The arrangement according to claim 5, wherein said first terminal and said second terminal of said insulating column have prefabricated screw holes for respective connection to said high voltage and ground.

7. The arrangement according to claim 1, wherein said insulating filler consists of a mixture of insulating filling material and a epoxy resin.

8. The arrangement according to claim 1, wherein said induction transformer includes a frame having a base plate with two vertically positioned bolts for securing the iron core on upper portions of the bolts, and a "U" shaped pressing iron for securing said iron core.

9. The arrangement according to claim 1, wherein each of said first and second capacitors are formed of multiple metallized capacitors in series or in parallel connection with each other.

* * * * *